United States Patent
Nakaya et al.

(10) Patent No.: US 6,172,458 B1
(45) Date of Patent: Jan. 9, 2001

(54) ORGANIC ELECTROLUMINESCENT DEVICE WITH ELECTRODE OF ALUMINUM-LITHIUM ALLOY

(75) Inventors: Kenji Nakaya, Chiba; Isamu Kobori, Ibaraki; Masami Mori, Yamanashi; Kazutoshi Ohisa, Ibaraki; Michio Arai, Tokyo, all of (JP)

(73) Assignee: TDK Corporation, Tokyo (JP)

( * ) Notice: Under 35 U.S.C. 154(b), the term of this patent shall be extended for 0 days.

(21) Appl. No.: 09/066,775

(22) Filed: Apr. 27, 1998

(30) Foreign Application Priority Data

Apr. 30, 1997 (JP) ................................................ 9-128001

(51) Int. Cl.$^7$ .............................. H05B 33/26; H05B 33/14
(52) U.S. Cl. ................................................................ 313/504
(58) Field of Search .................................... 313/503, 504, 313/506; 428/917

(56) References Cited

U.S. PATENT DOCUMENTS

| | | |
|---|---|---|
| 3,173,050 | 3/1965 | Gurnee . |
| 3,382,394 | 5/1968 | Mehl . |
| 4,720,432 * | 1/1988 | VanSklke et al. .................. 313/503 |
| 4,885,211 | 12/1989 | Tang et al. ........................... 313/506 |
| 5,429,884 * | 7/1995 | Namiki et al. ....................... 313/503 |

FOREIGN PATENT DOCUMENTS

| | | |
|---|---|---|
| 0 880 605 | 11/1998 | (EP) . |
| 60-165771 | 8/1985 | (JP) . |
| 2-15595 | 1/1990 | (JP) . |
| 4-212287 | 8/1992 | (JP) . |
| 5-121172 | 5/1993 | (JP) . |
| 5-159882 | 6/1993 | (JP) . |
| 10-12381 | 1/1998 | (JP) . |

* cited by examiner

Primary Examiner—Michael H. Day
(74) Attorney, Agent, or Firm—Oblon, Spivak, McClelland, Maier & Neustadt, P.C.

(57) ABSTRACT

An organic electroluminescent light emitting device comprises a hole injecting electrode, an electron injecting electrode and at least one organic layer between said electrodes. The electron injecting electrode is a film of an AlLi alloy formed by a sputtering technique. The AlLi alloy comprises 0.1 to 20 at % of lithium and contains as a subordinate component at least one of Cu, Mg and Zr in an amount of Cu: $\leq 10$ wt %
Mg: $\leq 5$ wt %
Zr: $\leq 0.5$ wt % per the total sum of aluminum and lithium.

14 Claims, 1 Drawing Sheet

ORGANIC ELECTROLUMINESCENT DEVICE WITH ELECTRODE OF ALUMINUM-LITHIUM ALLOY

BACKGROUND OF THE INVENTION

1. Field of the Invention

The present invention relates generally to an organic electroluminescent light emitting device (which will hereinafter be often called an organic EL device for short) using an organic compound and its production process, and more particularly to an electron injecting electrode and its production process.

2. Description of the Background

In recent years, organic EL devices have been under intensive investigation. One such organic EL device basically includes a transparent electrode (a hole injecting electrode) of tin-doped indium oxide (ITO), etc. A thin film is formed on the transparent electrode by evaporating a hole transporting material such as triphenyldiamine (TPD). A light emitting layer of a fluorescent material such as an aluminum quinolinol complex ($Alq^3$) is deposited on the hole transporting thin film. An electrode (an electron injecting electrode) is formed thereon from a metal having a low work function such as magnesium or Mg. This organic EL device attracts attentions because it can achieve a very high luminance ranging from several hundreds to tens of thousands $cd/m^2$ with a voltage of approximately 10 volts.

An electron injecting electrode considered to be effective for such organic EL devices is made up of a material capable of injecting more electrons into the light emitting layer or electron injecting and transporting layer. In other words, the lower the work function of a material, the more suitable is the material as the electron injecting electrode. Various materials having a low work function are available. Regarding materials used as the electron injecting electrode of organic EL devices, for instance, JP-A 2-15595 discloses an electron injecting electrode material comprising plurality of metals other than an alkali metal, at least one of which has a work function of less than 4 eV, typically MgAg.

A preferable material having a low work function is an alkali metal. U.S. Pat. Nos. 3,173,050 and 3,382,394 disclose NaK as one example of the alkali metal. However, an electron injecting electrode made up of the alkali metal is inferior to that built up of MgAg, etc. in terms of safety and reliability, because the alkali metal has high activity and so is chemically unstable.

In efforts to increase the stability of electron injecting electrodes using alkali metals, for instance, JPA's 60-165771, 4-212287, 5-121172 and 5-159882 propose electron injecting electrodes using AlLi alloys. Reference is here made to the concentration of Li in the AlLi alloys disclosed in these publications and their production processes. (1) JP-A 60-165771 teaches that the concentration of Li is in the range of 3.6 to 99.8 at % (1 to 99 wt %) and preferably 29.5 to 79.1 at % (10 to 50 wt %), and the examples given therein show AlLi alloys having an Li content in the range of 15.8 to 79.1 at % (4.8 to 50 wt %). These AlLi alloys are all formed by an evaporation technique. (2) JP-A 4-212287 teaches that the concentration of Li is at least 6 at % and preferably 6 to 30 at %, and the example given therein shows an AlLi alloy having an Li content of 28 at %. Therein, these alloy films may be formed by resistance heating co-evaporation, electron beam evaporation or sputtering. However the example refers to an evaporation process alone. (3) JP-A 5-121172 discloses AlLi alloys containing Li at concentrations of 0.0377 to 0.38 at % (0.01 to 0.1:100 by weight), and the examples given therein show that AlLi alloy films containing Li at concentrations of 0.060 to 0.31 at % (0.016 to 0.08:100 by weight) are formed by resistance heating evaporation or electron beam evaporation. Also, the publication discloses that AlLi alloy films having Li contents of up to 15.9 at % (50 or lower:1000 by weight) are formed, and the examples given therein show that AlLi alloy films having Li contents of 29.5 to 61.8 at % (10 to 30 wt %) re formed. (4) JP-A 5-159882 discloses AlLi alloys having Li contents of 5 to 90 at % and the examples given therein show AlLi alloys having Li contents of 16 to 60 at %. Therein, these alloy films are formed by double-evaporation wherein resistance heating evaporation is applied to an Li source while electron beam evaporation is applied to the other.

However, the AlLi alloy electrodes set forth in publications (1), (3) and (4) are all formed by vacuum evaporation alone. Although publication (2) refers to the formation of AlLi alloy electrodes by sputtering, only vacuum evaporation is described in the examples therein. Thus, the examples gives nothing specific about sputtering.

When an evaporation process is used, an AlLi alloy is employed as an Li evaporation source because lithium is in itself inferior in terms of chemical stability, film-forming capability, and adhesion. Since these metals have varying vapor pressures, however, it is required to rely upon double evaporation (co-evaporation) with Al. A problem with double evaporation is, however, that it is not easy to gain composition control and so it is difficult to obtain the optimum mixing ratio in a stable manner for each batch. Thus, the actually obtainable Li concentration is shifted to a relatively high concentration side of 16 to 79 at %, and cannot be kept invariable. A high Li concentration is a factor in the degradation of devices because the composition is chemically unstable, resulting in deterioration of its film-forming capability and adhesion. In addition, devices having consistent quality cannot be obtained. When evaporation is carried out using a single evaporation source, on the other hand, the concentration of Li drops to 0.38 at % or lower, yielding an alloy having a high work function. This in turn gives rise to an electron injection efficiency drop, and so renders it difficult to obtain devices having practical enough properties.

An electron injecting electrode film formed by a vacuum evaporation process is poor in denseness, and adhesion to an organic layer interface, yielding an organic EL device with a light emission efficiency drop and dark spots produced by the delamination of the electrode. Thus, the obtained EL device offers problems in connection with its properties and service life, and the quality of what is displayed on it.

A material having a low work function, like Li, is usually formed thereon with an oxide layer, because the material is of high reactivity with respect to oxygen or moisture, and is usually handled in the atmosphere for feed, and supply purposes. To form an electron injecting electrode of high quality, it is desired to carry out evaporation after removal of the oxide layer form the surface of the material. However, this is difficult because, in a rare case alone, the oxide has a lower evaporation temperature or a higher vapor pressure than does a pure metal. It is thus not easy to form a high-quality electron injecting electrode consisting of a pure metal film. In addition, when a film obtained from such an oxide material by evaporation is formed on the interface between the electron injecting electrode and the organic layer or within the electrode, the resulting work function and electrical conductivity deviate from those of the pure metal. It is thus impossible to obtain any desired EL properties.

From a practical perspective, the vacuum evaporation process have various productivity problems, among which it is required to make a material replacement or addition within a short time of period, a film having a large area is inconsistent in terms of composition control, film thickness and film quality, and consistent composition control, film quality reproducibility and consistent film quality are not obtained at an increased film forming rate.

SUMMARY OF THE INVENTION

It is therefore an object of the invention to achieve an organic EL device in which the ability of an electron injecting electrode film to be formed at its interface with an organic layer and the adhesion of the electron injecting electrode film to the organic layer are so improved that ever higher luminance, ever greater efficiency, ever longer service life and ever higher quality of what is displayed thereon are achievable.

Such an object is achieved by the inventions defined below as (1) to (5)

(1) An organic EL device comprising a hole injecting electrode, an electron injecting electrode and at least one organic layer between said electrodes, wherein:

said electron injecting electrode is a film of an aluminum lithium alloy formed by a sputtering technique, said aluminum lithium alloy comprising 0.1 to 20 at % of lithium and containing as a subordinate component at least one of copper, magnesium and zirconium in an amount of copper: $\leq 10$ wt % magnesium: $\leq 5$ wt % zirconium: $\leq 0.5$ wt % per a total sum of aluminum and lithium.

(2) The organic EL device of (1), wherein said electron injecting electrode contains lithium in an amount of $0.4 \leq Li < 6.5$ at %.

(3) The organic EL device of (1), wherein said electron injecting electrode contains lithium in an amount of $6.5 \leq Li \leq 14$ at %.

(4) A process of producing an organic EL device by forming an electron injecting electrode by a sputtering technique using as a target an aluminum lithium alloy comprising 0.1 to 20 at % of lithium and containing as a subordinate component at least one of copper, magnesium and zirconium in an amount of copper: $\leq 10$ wt % magnesium: $\leq 5$ wt % zirconium: $\leq 0.5$ wt % per a total sum of aluminum and lithium.

(5) The process of (4), wherein said sputtering technique is a DC sputtering process.

BRIEF DESCRIPTION OF THE DRAWINGS

The above and other objects, features, and advantages of the invention will be better understood from the following description taken in conjunction with the accompanying drawing.

DETAILED DESCRIPTION OF THE PREFERRED EMBODIMENTS

Figure 1:
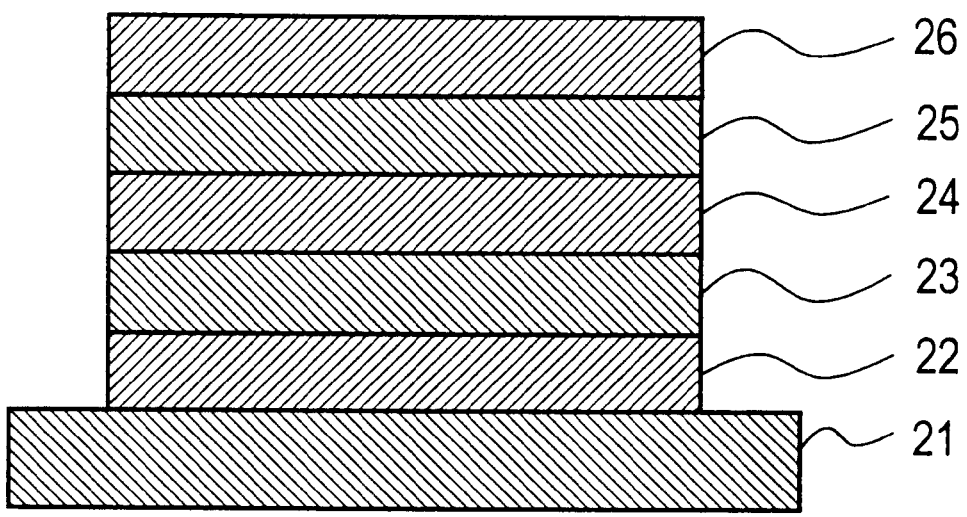
FIG. 1 is a general schematic illustrative of one exemplary embodiment of the organic EL device according to the invention.

Some preferred embodiments of the invention will now be explained at great length.

The organic EL device of the invention comprises a hole injecting electrode, an electron injecting electrode and at least one organic layer between said electrodes, wherein:

said electron injecting electrode is a film of an aluminum lithium alloy formed by a sputtering technique, said aluminum lithium alloy (hereinafter AlLi alloy for short) comprising 0.1 to 20 at % of lithium or Li and containing as a subordinate component at least one of copper or Cu, magnesium or Mg and zirconium or Zr in an amount of Cu: $\leq 10$ wt %

Mg: $\leq 5$ wt %

Zr: $\leq 0.5$ wt % per the total sum of Al and Li.

In the electron injecting electrode film formed by the sputtering technique, the atoms or atom groups upon sputtering have a kinetic energy relatively higher than would be obtained with the evaporation technique, so that the adhesion of the electron injecting electrode film to the organic layer at their interface is improved due to a surface migration effect. In addition, an oxide layer is removed in vacuum from the surface of the electrode by pre-sputtering or moisture or oxygen is removed from the organic layer interface, on which they are adsorbed, by reverse sputtering to form a clean electrode-organic layer interface or a clean electrode, so that consistent organic EL devices of high quality can be produced. For the target, the AlLi alloys having the aforesaid composition range, pure Al, and pure Li may be used alone or in combination with an additional target comprising the subordinate component or components or with the addition of the subordinate component or components thereto. It is also acceptable to use a mixture of materials having largely varying vapor pressures as the target, because there is only slight a deviation of the composition of the resultant film from the target composition. There is thus no limitation on the material used with the sputtering technique, whereas there are some limitations such as vapor pressure on the evaporation technique. The sputtering technique is additionally advantageous over the evaporation technique in terms of consistent film thickness and quality as well as productivity, because it is unnecessary to feed the raw material over an extended period of time.

The electron injecting electrode formed by the sputtering technique is a film so very dense that the penetration of moisture into the film is much more reduced as compared with a coarse film prepared by evaporation, and so the chemical stability of the film is much more increased.

This ensures the production of organic EL devices having ever longer service life.

The content of Li in the electron injecting electrode is 0.1 at $\% \leq Li \leq 20$ at %. Too little or too much lithium result in an electron injection efficiency drop. Too much lithium makes the stability of the electrode worse. The content of L in the electron injecting electrode is preferably 0.4 at $\% \leq Li < 6.5$ at %, more preferably 0.4 at $\% \leq Li < 5$ at %, yet more preferably 0.4 at $\% \leq Li \leq 4.5$ at %, yet more preferably 0.4 at $\% \leq Li \leq 4$ at %, and most preferably 0.4 at $\% \leq Li \leq 3$ at %.

Alternatively, it is acceptable that preferably 6.5 at $\% \leq Li \leq 14$ at % and more preferably 7 at $\% \leq Li \leq 12$ at %. When the amount of the element Li is too much, the stability of the electron injecting electrode upon film formation becomes worse. With too little lithium, on the other hand, the advantages of the invention are unachievable. To increase t stability of light emission luminance, it is preferable to use Li at a somewhat higher concentration. To increase the stability of driving voltage, on the contrary, it is preferable to use Li at a somewhat lower concentration.

In addition to aluminum and lithium, the electron injecting electrode of the invention contains as a subordinate component at least one of Cu, Mg and Zr in an amount, per the total sum of Al and Li, of preferably Cu: $\leq 10$ wt %
Mg: $\leq 5$ wt %
Zr: $\leq 0.5$ wt % more preferably

Cu: 0.05 to 10 wt %
Mg: 0.01 to 5 wt %
Zr: 0.01 to 0.5 wt % most preferably

Cu: 0.1 to 6 wt %
Mg: 0.1 to 3 wt %
Zr: 0.01 to 0.5 wt %

The physical properties of the electron injecting electrode thin film is much more improved by the incorporation of any one of Cu, Mg and Zr therein. Consequently, the adhesion of the electron injecting electrode to the organic layer is much more improved, resulting in an improvement in electron injection efficiency and a decrease in stress distortion, etc. in the film. This in turn contributes to the stabilization of the film, preventing the occurrence of dark spots and, hence, an ever greater increase in the service life of the device.

The subordinate component or components may be added to the electron injecting electrode by using a target of the subordinate metal element or elements in combination with the aforesaid AlLi target or carrying out sputtering with chips of the subordinate metal element or elements placed on the AlLi target. However, if the ease, with which the composition of the electron injecting electrode to be formed is stabilized to regulate the content or contents of the subordinate component or components within the aforesaid range, is taken into account, it is then preferable to use a mixed target of AlLi with the subordinate component element or elements. Preferably, such a target is obtained by an atmospheric melting process. That is, the raw material is melted in a non-oxidizing atmosphere to obtain a mixed melt. Then, the mixed melt is cooled in a non-aqueous solvent such as ethylene glycol, hot rolled, and latched or otherwise machined to obtain a desired target shape. Besides, use may be made of rapidly solidified powder alloys, composite materials, mechanically alloyed powders, etc. The target is permitted to have a microstructure by the addition of at least one of Cu, Mg and Zr thereto, thereby preventing abnormal discharge. In addition to these subordinate components, it is also acceptable that the target may contain as additives or inevitable impurities one or two or more of iron or Fe, silicon or Si, oxygen or O, etc., each in an amount of up to 5 wt %.

The electron injecting electrode formed may have a concentration gradient structure wherein the concentration of Li varies in such a thickness-wise direction that a good many of Li elements are present on the interface between the electrode and the organic layer while a good many of Al elements are present on the opposite surface. By imparting such a concentration gradient to the electron injecting electrode, Li elements having a low work function can be shifted at a high concentration to the electrode-organic layer interface that is required to have a function of injecting electrons, while Li elements of high reactivity can be shifted at a low concentration to the opposite surface that is likely to come in contact with the air. It is thus possible to achieve an electron injecting electrode having increased stability while high electron injection efficiency is maintained.

To impart a concentration gradient across the electron injecting electrode is easily achieved by controlling sputtering pressure, preferably as will be described later. Alternatively, this may be achieved by simultaneously using an AlLi alloy target and an Al metal target while their respective film forming rates are placed under control. Instead of such a continuous concentration gradient, a non-continuous (stepwise) concentration gradient may also be imparted across the electron sputtering electrode in such a way that a film having a varying proportion of the Li element is formed.

Preferably, the sputtering gas pressure during sputtering is in the range of 0.1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such an Li concentration gradient as defined above.

For the sputtering gas, use is made of inert gases employed with ordinary sputtering systems. For reactive sputtering, reactive gases such as $N_2$, $H_2$, $O_2$, $C_2H_4$ and $NH_3$ may be used in addition to these gases. However, preference is given to any one of argon or Ar, krypton or Kr and xenon or Xe or a mixed gas containing at least one of these gases. These gases are preferable due to their inertness and relatively large atomic weight. It is particularly preferably to use Ar, Kr, and Xe alone. When the Ar, Kr or Xe gas is used, sputtered atoms impinge repeatedly on the gas in the process of reaching the substrate, and arrive at the substrate while their kinetic energy is diminished. Such sputtered atoms with diminished kinetic energy cause less physical damage to an organic EL structure. It is also preferable to use a mixed gas containing at least one of Ar, Kr and Xe. When such a mixed gas is used, Ar, Kr, and Xe act as a main sputtering gas provided that the sum of partial pressures of Ar, Kr and Xe is at least 50%. By using at least one of Ar, Kr and Xe in combination with any desired gas, it is thus possible to carry out reactive sputtering while the aforesaid advantages are maintained.

In the practice of the invention, it is possible to use an RF sputtering process using an RF power source or the like as the sputtering technique. In view of the ease with which the film forming rate is controlled, and less damage to an organic EL device structure, however, it is preferable to use a DC sputtering process. Power for operating a DC sputtering system is in the range of preferably 0.1 to 10 $W/cm^2$ and especially 0.5 to 7 $W/cm^2$. The film forming rate is preferably in the range of 5 to 100 nm/min. and especially 10 to 50 nm/min.

The electron injecting electrode may have at least a certain thickness enough for the injection of electrons, e.g. of at least 1 nm, and preferably at least 3 nm. Thus, a film thickness of the order of 3 to 500 nm is usually preferable although there is no upper limit thereon.

The organic EL device of the invention may be provided with a protective film comprising at least one of the oxide, nitride and carbide of a constituting material for the electron injecting electrode. In this case, it is to be noted that the raw material for the protective film has usually the same composition as that of the electron injecting electrode material, although it may have somewhat different compositions or it may be free of one or more components of that material. Thus, it is possible to form the protective film continuously from the electron injecting electrode by using the same material as the electron injecting electrode material for the protective film.

In the invention, the oxygen content of the oxide, the nitrogen content of the nitride, and the carbon content of the carbide may deviate more or less from the stoichiometric composition, or they may be 0.5 to 2 times as large as the stoichiometric composition.

Preferably, the same material as the electron injecting electrode material is used for the target, and $O_2$, CO or the like is used as the reactive gas for oxide formation, $N_2$, NH NO, $NO_2$, $N_2O$ or the like is used as the reactive gas for nitride formation, and $CH_4$, $C_2H_2$, $C_2H_4$ or the like is used as the reactive gas for carbide formation. These reactive gases may be used alone or in combination of two or more.

The protective film may have at least a certain thickness enough to ensure prevention of penetration of moisture, oxygen or organic solvents, and so may have a thickness in the range of preferably at least 50 nm, more preferably at least 100 nm, and most preferably 100 to 1,000 nm.

Preferably but not exclusively, the total thickness of the electron injecting electrode plus the protective film is usually of the order of 100 to 1,000 nm.

By the provision of such a protective film, it is possible to prevention oxidation or the like of the electron injecting electrode and so drive the organic EL device stably over an extended period of time.

The organic EL device produced according to the invention comprises a substrate, a hole injecting electrode formed on the substrate and an electron injecting electrode formed thereon, and further includes at least one charge transporting layer and at least one light emitting layer between these electrodes as well as a protective layer in the form of the uppermost layer. In this regard, it is to be noted that the charge transporting layer may be dispensed with. In the invention, the electron injecting electrode in a film form is made up of a metal, compound or alloy having a low work function by the sputtering technique as already noted, and the hole injecting electrode in a film form is constructed of tin-doped indium oxide (ITO), zinc-doped indium oxide (IZO), ZnO, $SnO_2$, $In_2O_3$ or the like by the sputtering technique.

A representative embodiment of the organic EL device produced according to the invention is shown in FIG. 1. An EL device as shown in FIG. 1 comprises a substrate 21, and a hole injecting electrode 22, a hole injecting and transporting layer 23, a light emitting and electron injecting/transporting layer 24, an electron injecting electrode 25 and a protective layer 26 formed on the substrate in the described order.

The organic EL device of the invention is not limited to the structures illustrated, and so may have various structures. For instance, the light emitting layer may be provided in a single layer form and between this light emitting layer and the electron injecting electrode there may be interleaved an electron injecting and transporting layer. If required, the hole injecting and transporting layer 23 may be mixed with the light emitting layer.

The electron injecting electrode in a film form may be formed as mentioned above, the light emitting layer and other organic layers in film forms may be formed as by vacuum evaporation, and the hole injecting electrode in a film form may be formed as by evaporation or sputtering. If required, these films can be each patterned by mask evaporation or film formation followed by etching or the like, so that a desired light emitting pattern can be obtained. If the substrate is made up of thin film transistors (TFT), the respective films are then formed according to the TFT pattern for the immediate formation of a display or drive pattern.

If required, an additional protective film may be formed after the formation of the electrode. The protective film may be formed of either an inorganic material such as $SiO_x$ or an organic material such as Teflon. The protective film may be either transparent or opaque, and has a thickness of the order of 50 to 1,200 nm. The protective film may be formed either by the aforesaid reactive sputtering process or conventional processes such as general sputtering, evaporation or like other processes.

In the practice of the invention, it is preferred to form a sealing layer on the device in order to prevent oxidation of the organic and electrode layers. The sealing layer for preventing penetration of moisture may be formed by bonding sealing plates such as glass plates with adhesive resin layers of low hygroscopicity such as commercially available sheets of photo-curable adhesives, epoxy adhesives, silicone adhesives, and crosslinking ethylene-vinyl acetate copolymer adhesives. Instead of the glass plates, metal or plastic plates may also be used.

Next, the organic layers provided in the EL device of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the anode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about 1/10 times to about 10 times as large as, the thickness of the light emitting layer although it depends on the design of the recombination/light emitting region.

When the electron or hole injecting and transporting layer is separated into an injecting layer and a transporting layer, it is preferable that the injecting layer is at least 1 nm thick and the transporting layer is at least 1 nm, preferable at least 20 nm thick. The upper limit on thickness is usually about 500 nm for the injecting layer and about 500 nm for the transporting layer. The same film thickness applies when two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, for instance, quinacridone, rubrene, and styryl dyes. Use may also be made of quinoline derivatives such as metal complex dyes containing 8-quinolinol or its derivative as ligands, for instance, tris(8-quinolinolato) aluminum, tetraphenylbutadiene, anthracene, perylene, coronene, and 12-phthaloperinone derivatives. Use may further be made of phenyanthracene derivatives disclosed in Japanese Patent Application No. 6-110569, and tetraarylethene derivatives disclosed in Japanese Patent Application 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis (2-methyl-8-quinolinolato)(2,3-dimethylphenolato) aluminum (III), bis(2-methyl-8-quinolinolato)(2,6-dimethylphenolato)aluminum (III), bis(2-methyl -8-quinolinolato)(3,4-dimethylphenolato) aluminum (III), bis(2-methyl-8-quinolinolato)(3,5-dimethylphenolato) aluminum (III), bis(2-methyl-8-quinolinolato)(3,5-di-tert-butylphenolato)aluminum (III), bis(2-methyl-8-quinolinolato)(2,6-diphenylphenolato)aluminum (III), bis (2-methyl-8-quinolinolato)(2,4,6-triphenylphenolato) aluminum (III), bis(2-methyl-8-quinolinolato)(2,3,6-trimethylphenolato)aluminum (III), bis(2-methyl-8-quinolinolato) 2,3,5,6-tetramethylphenolato)aluminum (III), bis(2-methyl-8-quinolinolato)(1-naphtholato)aluminum (III), bis(2-methyl-8-quinolinolato)(2-naphtholato) aluminum (III), bis(2,4-dimethyl-8-quinolinolato)(o-phenylphenolato)aluminum (III), bis(2,4-dimethyl-8-quinolinolato)(p-phenylphenolato)aluminum (III), bis(2,4-dimethyl-8-quinolinolato) (m-phenylphenolato) aluminum (III), bis(2,4-dimethyl-8-quinolinolato)(3,5-dimethylphenolato)aluminum (III), bis(2,4-dimethyl-8-quinolinolato)(3,5-di-tert-butylphenolato)aluminum (III), bis(2-methyl-4-ethyl-8-quinolinolato)(p-cresolato) aluminum (III), bis(2-methyl-4-methoxy-8-quinolinolato) (p-phenylphenolato)aluminum (III), bis(2-methyl-5-cyano-8 quinolinolato)(o-cresolato)aluminum (III), and bis (2-methyl-6-trifluoromethyl-8-quinolinolato)(2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxobis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III), bis(2-methyl-5-trifluoromethyl-8-quinolinolato)aluminum (III)-$\mu$-oxo-bis (2-methyl-5-trifluoromethyl-8-quinolinolato)aluminum (III), etc.

Other preferable host substances include phenylanthracene derivatives disclosed in Japanese Patent Application No. 6-110569, tetraarylethene derivatives disclosed in Japanese Patent Application No. 6-114456, etc.

In the practice of the invention, the light emitting layer may also serve as an electron injecting and transporting layer. In this case, it is preferable to use tris(8-quinolinolato) aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads t an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum (Alq$^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring, as already mentioned.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 0/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyldiamine (TPD)), aromatic tertiary amines, hydrazone derivatives, carbozole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed contiguous to the anode (ITO, etc.). It is also preferred to use a compound having good thin film forming ability at the anode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris(8-quinolinolato)aluminum ($Alq^3$), oxadiazole derivatives perylene derivatives, pyridine derivatives, pyrimidine derivatives, quinoxaline derivative, diphenylquinone derivatives, and nitro-substituted fluorene derivatives. Th electron injecting and transporting layer may also serve as light emitting layer as previously mentioned. In this case, it is preferable to use tris(8-quinolilato)aluminum, etc. Like the light emitting layer, the electron injecting and transporting layer may then be formed by evaporation or the like.

Where the electron injecting and transporting layer is double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the substrate material, transparent or translucent materials such as glass, quartz and resins are used. The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 μm. The use of a thin film having a crystal grain diameter exceeding 0.1 μm results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of up to $10^{-4}$ Pa. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL device of the invention is generally of the DC drive type while it may be of the AC or pulse drive type. The applied voltage is generally of the order of 2 to 20 volts.

EXAMPLE

The present invention are explained more specifically with reference to some examples and comparative examples.

Example 1

A glass substrate having a 100 nm-thick patterned ITO transparent electrode (a hole injecting electrode) prepared by a sputtering process was ultrasonically washed with neutral detergent, acetone, and ethanol, and then pulled up from boiling ethanol, followed by drying. This substrate was cleaned on its surface with UV/O$_3$, and fixed to a substrate holder in a vacuum evaporation system, which was evacuated to a vacuum of $1 \times 10^{-4}$ Pa or lower. Then, 4,4',4"-tris(-N-(3-methylphenyl)-N-phenylamino)triphenylamine (m-MTDATA) was evaporated at a deposition rate of 0.2 nm/sec. to a thickness of 40 nm to form a hole injecting layer. While the vacuum was maintained, N,N'-diphenyl-N, N'-m-tolyl-4,4'-diamino-1,1'-biphenyl (TPD) was evaporated at a deposition rate of 0.2 nm/sec. to a thickness of 35 nm to form a hole transporting layer. With the vacuum still kept, Alq$^3$ was evaporated at a deposition rate of 0.2 nm/sec. to a thickness of 50 nm to form a light emitting and electron injecting/transporting layer. With the vacuum still kept, this EL device structure substrate was then transferred from the vacuum evaporation system to a sputtering system wherein sputtering was carried out at a sputtering pressure of 1.0 Pa to form an AlLi electron injecting electrode film of 200 nm in thickness. Ar was used as the sputtering gas at an input power of 100 W, a target size of 4 inches in diameter and a distance of 90 mm between the substrate and the target. The target was composed of:

Li: 8.0 at %
Cu: 0.50 at %
Mg: 0.93 wt %
Zr: 0.065 wt %
Al: balance

The film composition of the electron injecting electrode was found to be composed of:

Li: 7.1 at %
Cu: 1.4 wt %
Mg: 0.87 wt %
Zr: 0.11 wt %
Al: balance

DC voltage was applied across the obtained organic EL device in a dry argon atmosphere. Consequently, the organic EL device was found to have high luminance and efficiency as seen from a maximum luminance of 42,000 cd/m$^2$ at 14 V and 920 mA/cm$^2$. On the other hand, DC voltage was applied across the organic EL device to continuously drive the device at a constant current density of 10 mA/cm$^2$. In the initial stage, the device was found to emit green light of 660 cd/m$^2$ (light emission maximum wavelength λmax=530 nm) at 6.6 V. The half life of luminance was 800 hours during which a driving voltage increase of 1.9 V was observed. Until the lapse of 300 hours, nowhere in the device were the occurrence and growth of dark spots of 100 μm or greater in size observed.

Comparative Example 1

An organic EL device was obtained and estimated as in Example 1 with the exception that the electron injecting electrode was formed of MgAg (a speed ratio of 10:1) by vacuum co-evaporation. Consequently, the device was found to have a maximum luminance of 18,000 cd/m$^2$ at 15 V and 500 mA/cm$^2$. On the other hand, DC voltage was applied across the organic EL device to drive the device at a constant current of 10 mA/cm$^2$. In the initial stage, a luminance of 470 cd/M$^2$ was observed at 6.9 V, and the half life of luminance was 400 hours during which a driving voltage increase of 2.6 V was observed. Upon the lapse of 96 hours, the occurrence and growth of dark spots of 100 μm or greater in size were already observed.

Comparative Example 2

An organic EL device was prepared and estimated as in Example 1 with the exception that an electron injecting electrode was formed of AlLi (with Li concentration of 28 at %) by vacuum co-evaporation. In the initial stage, a luminance of 470 cd/m$^2$ was observed at 7.4 V, and the half life of luminance was 300 hours during which a driving voltage increase of 3.6 V was observed. Upon the lapse of 48 hours, the occurrence and growth of dark spots of 100 μm or greater in size were already observed.

Comparative Example 3

Upon making a target replacement, an electron injecting electrode film consisting of AlLi alone was formed to obtain an organic EL device. The composition of the electrode film was found to having an Li content of 7.3 at %. This organic EL device was estimated as in Example 1. The device was found to have a maximum luminance of (38,000 cd/M$^2$) at 14 V and 825 mA/cm$^2$. In the initial stage, the device was found to emit green light of 560 cd/M$^2$ (light emission maximum wavelength λmax=530 nm) at 6.6 V. The half life of luminance was 650 hours during which a driving voltage increase of 1.5 V was observed. Upon the lapse of 250 hours, the occurrence and growth of dark spots of 100 μm or greater in size were already observed.

Example 2

Using the same target as in Example 1, an electron injecting electrode film was prepared with the exception that the pressure for sputtering was changed to 4.5 Pa. The composition of the electrode film was found to have an Li content of 10.5 at %. An organic EL device was prepared and estimated under otherwise the same conditions as in Example 1. Equivalent properties were obtained.

Example 3

A device was prepared following Example 1 with the exception that a different target was used with an electron injecting electrode film having the following composition:

Li: 2.2 at %
Cu: 3.2 wt %
Mg: 0.12 wt %
Zr: 0.12 wt %
Al: balance

The obtained organic EL device was estimated as in Example 1. In the initial stage, the device was found to emit green light of 580 cd/M$^2$ (light emission maximum wavelength λmax=530 nm) at 6.8 V. The half life of luminance was 680 hours during which a driving voltage increase of 1.1 V was observed. Until the lapse of 350 hours, nowhere in the device were the occurrence and growth of dark spots of 100 μm or greater in size observed.

It is thus possible to achieve an organic EL device having an electron injecting electrode that is excellent in adhesion to its interface with an organic layer and electron injection efficiency, so that it has an improved light emission property, causes less damage to the organic layer, inhibits the occurrence of dark spots, and undergoes less degradation.

Japanese Patent Application No. 128001/1997 is herein incorporated by reference.

While the invention has been described with reference to preferred embodiments, it will be obvious to those skilled in the art that various changes may be made and equivalents may be substituted for elements thereof without departing from the scope of the invention. In addition, many modifications may be made to adapt a particular situation or material to the teachings of the invention departing from the essential scope thereof. Therefore, it is intended that the invention not be limited to the particular embodiments disclosed as the best mode contemplated for carrying out the invention, but that the invention will include all embodiments falling within the scope of the appended claims.

What we claim is:

1. An organic electroluminescent light emitting device comprising a hole injecting electrode, an electron injecting electrode and at least one organic layer between said electrodes, wherein:
   said electron injecting electrode is a film of an aluminum lithium alloy formed by a sputtering technique,
   said aluminum lithium alloy comprising 0.1 to 20 at % of lithium and containing as a subordinate component at least one of copper, magnesium and zirconium in an amount of
   copper: ≦10 wt %
   magnesium: ≦5 wt %
   zirconium: ≦0.5 wt % per a total sum of aluminum and lithium.

2. The organic electroluminescent light emitting device of claim 1, wherein said electron injecting electrode contains lithium in an amount of 0.4 at %≦Li<6.5 at %.

3. The organic electroluminescent light emitting device of claim 2, wherein said electron injecting electrode contains lithium in an amount of 0.4 at %≦Li<5 at %.

4. The organic electroluminescent light emitting device of claim 3, wherein said electron injecting electrode contains lithium in an amount of 0.4 at %≦Li≦4.5 at %.

5. The organic electroluminescent light emitting device of claim 1, wherein said electron injecting electrode contains lithium in an amount of 6.5 at %≦Li≦14 at %.

6. The organic electroluminescent light emitting device of claim 5, wherein said electron injecting electrode contains lithium in an amount of 7 at %≦Li≦12 at %.

7. The organic electroluminescent light emitting device of claim 1, wherein said copper, magnesium and zirconium are contained in the amounts of:
   Cu: 0.05 to 10 wt %
   Mg: 0.01 to 5 wt %
   Zr: 0.01 to 0.5 wt %.

8. The organic electroluminescent light emitting device of claim 7, wherein said copper, magnesium and zirconium are contained in the amounts of:
   Cu: 0.1 to 6 wt %
   Mg: 0.1 to 3 wt %
   Zr: 0.01 to 0.5 wt %.

9. The organic electroluminescent light emitting device of claim 1, wherein said electron injecting electrode contains a concentration gradient structure having a preponderance of Li elements present on an interface between the electrode and the organic layer, and a preponderance of Al elements on an opposite surface.

10. The organic electroluminescent light emitting device of claim 1, wherein said electron injecting electrode has a thickness of from about 1 to 500 nm.

11. The organic electroluminescent light emitting device of claim 1, wherein said electron injecting electrode further comprises a protective film thereon comprising at least one of an oxide, carbide or nitride of a constituting material of the electrode.

12. The organic electroluminescent light emitting device of claim 11, wherein said protective film has a thickness of about 50 to 1,000 nm.

13. A process of producing an organic electroluminescent light emitting device by forming an electron injecting electrode by a sputtering technique using as a target an aluminum lithium alloy comprising 0.1 to 20 at % of lithium and containing as a subordinate component at least one of copper, magnesium and zirconium in an amount of
   copper: ≦10 wt %
   magnesium: ≦5 wt %
   zirconium: ≦0.5 wt %
per a total sum of aluminum and lithium.

14. The process of claim 13, wherein said sputtering technique is a DC sputtering process.

* * * * *